(12) United States Patent
Fan et al.

(10) Patent No.: US 12,727,204 B2
(45) Date of Patent: Sep. 1, 2026

(54) NON-VOLATILE MEMORY DEVICE

(71) Applicant: IOTMEMORY TECHNOLOGY INC., Taipei City (TW)

(72) Inventors: Der-Tsyr Fan, Taoyuan City (TW); I-Hsin Huang, Taoyuan City (TW); Tzung-Wen Cheng, New Taipei City (TW); Yu-Ming Cheng, Yilan County (TW)

(73) Assignee: IOTMEMORY TECHNOLOGY INC., Taipei City (TW)

( * ) Notice: Subject to any disclaimer, the term of this patent is extended or adjusted under 35 U.S.C. 154(b) by 341 days.

(21) Appl. No.: 18/108,676

(22) Filed: Feb. 13, 2023

(65) Prior Publication Data

US 2024/0274682 A1 Aug. 15, 2024

(51) Int. Cl.

| | |
|---|---|
| ***H10D 30/68*** | (2025.01) |
| ***H10B 41/35*** | (2023.01) |
| ***H10D 30/01*** | (2025.01) |
| ***H10D 64/01*** | (2025.01) |

(52) U.S. Cl.

CPC ......... *H10D 30/6892* (2025.01); *H10B 41/35* (2023.02); *H10D 30/0411* (2025.01); *H10D 30/683* (2025.01); *H10D 64/035* (2025.01)

(58) Field of Classification Search

None

See application file for complete search history.

(56) References Cited

U.S. PATENT DOCUMENTS

| | | | | |
|---|---|---|---|---|
| 10,644,011 B1 * | 5/2020 | Fan | ........................ | H10B 41/10 |
| 2006/0071265 A1 * | 4/2006 | Koh | ........................ | H10B 69/00 438/266 |
| 2007/0257299 A1 * | 11/2007 | Chen | ........................ | H10B 41/35 257/315 |

FOREIGN PATENT DOCUMENTS

| | | |
|---|---|---|
| TW | M513458 U | 12/2015 |
| TW | 202018917 A | 5/2020 |
| TW | 202044551 A | 12/2020 |

* cited by examiner

*Primary Examiner* — Xiaoming Liu
(74) *Attorney, Agent, or Firm* — Winston Hsu

(57) ABSTRACT

A non-volatile memory device includes at least one memory cell including a substrate, an assist gate, a byte select gate, a floating gate, and an upper gate. The substrate includes a first doped region and a second doped region. The assist gate is disposed on the substrate and adjacent to the second doped region. The byte select gate is disposed on the substrate and adjacent to the first doped region. The floating gate is disposed on the substrate and between the assist gate and byte select gate, and the floating gate includes an upper edge higher than top surfaces of the assist gate and the byte select gate. The upper gate covers the assist gate and the floating gate, and the upper gate is spaced apart from the byte select gate. The upper edge of the floating gate is embedded in the upper gate.

17 Claims, 10 Drawing Sheets

200
100-2
112
110
222
252
253
254
274
272
273
222
218
226
224
208
100-1
260
235
234
236
206
203
202
204
242
102
X
Z
Y 304
112
110
226
252
253
254
222
218
224
208
235
234
236
206
203
202
204
102
X
Z
Y

NON-VOLATILE MEMORY DEVICE

BACKGROUND OF THE INVENTION

1. Field of the Invention

The invention relates to a semiconductor device. More particularly, the invention relates to a non-volatile memory device.

2. Description of the Prior Art

Since a non-volatile memory device can, for instance, repeatedly perform operations such as storing, reading, and erasing data, and since stored data is not lost after the non-volatile memory device is shut down, the non-volatile memory device has been extensively applied in personal computers and electronic equipment.

A conventional structure of non-volatile memory device has a stack-gate structure, including a tunneling oxide layer, a floating gate, a coupling dielectric layer, and a control gate disposed on a substrate in order. When a programming or erasing operation is performed on such a flash memory device, a suitable voltage is respectively applied to the source region, the drain region, and the control gate, such that electrons are injected into a floating gate, or electrons are pulled out from the floating gate.

In the programming and erase operation of the non-volatile memory device, a greater gate-coupling ratio (GCR) between the floating gate and the control gate generally means a lower operating voltage is needed for the operation, and the operating speed and the efficiency of the flash memory device are significantly increased as a result. However, during programming or erase operations, electrons have to be injected into or pulled out of the floating gate through a tunneling oxide layer disposed under the floating gate, which often causes damages to the structure of the tunneling oxide layer and thus reduces the reliability of the memory device.

In order to increase the reliability of the non-volatile memory device, an erase gate is adopted and incorporated into to the memory device, which is capable of pulling the electrons from the floating gate by applying a positive voltage to the erase gate. Thus, since the electrons in the floating gate is pulled out through a tunneling oxide layer disposed on the floating gate rather than through the tunneling oxide layer disposed under the floating gate, the reliability of the memory device is further improved.

For a non-volatile memory array included in the non-volatile memory device mentioned above, the programming and erase operations involve programming and erasing all of the bit cells of each bytes or words which share the same word line gate (also called word line) and control gate. In other words, all of the bit cells of each bytes or words which share the same word line gate and control gate are programed/erased concurrently during a programming/erase process. Thus, the non-volatile memory device is unable to perform a byte-erase and byte-programming operation.

However, in many non-volatile memory applications, there is the need for small sector or individual byte memory array operation without disturbing other non-volatile memory cells which are in different sectors or byte regions but share the same world lines.

SUMMARY OF THE INVENTION

In view of this, one object of the present invention is set to provide a non-volatile memory device which is able to erase and program each byte of the non-volatile memory device independently.

According to some embodiments of the present disclosure, a non-volatile memory device includes at least one memory cell including a substrate, an assist gate, a byte select gate, a floating gate, and an upper gate. The substrate includes a first doped region and a second doped region. The assist gate is disposed on the substrate and adjacent to the second doped region. The byte select gate is disposed on the substrate and adjacent to the first doped region. The floating gate is disposed on the substrate and between the assist gate and byte select gate, and the floating gate includes an upper edge higher than top surfaces of the assist gate and the byte select gate. The upper gate covers the assist gate and the floating gate, and the upper gate is spaced apart from the byte select gate. The upper edge of the floating gate is embedded in the upper gate.

According to some embodiments of the present disclosure, a non-volatile memory device includes a row of memory cells, a first erase gate line, a second erase gate line, a first select gate line, and a second select gate line. The memory cells are arranged in a first byte region and second byte region respectively, and each memory cell includes an assist transistor, a floating gate transistor, and a select transistor connected in series. The first erase gate line is electrically connected to erase gates of the floating gate transistors in the first byte region. The second erase gate line is electrically connected to erase gates of the floating gate transistors in the second byte region, and the second erase gate line is configured to be biased independently of the first erase gate line. The first select gate line is electrically connected to select gates of the select transistors in the first byte region. The second select gate line is electrically connected to select gates of the select transistors in the second byte region, and the second select gate line is configured to be biased independently of the first select gate line.

According to some embodiments of the present disclosure, a method of manufacturing a non-volatile memory device includes: providing a substrate; forming an assist gate on the substrate; forming a floating gate adjacent to the assist gate, where the floating gate comprising an upper edge higher than a top surface of the assist gate; forming a conductive layer covering the assist gate and the floating gate; and pattering the conductive layer to form an upper gate and a select gate spaced apart from each other, where the upper gate covers the assist gate and the floating gate, and the upper edge of the floating gate is embedded in the upper gate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

Figure 3:
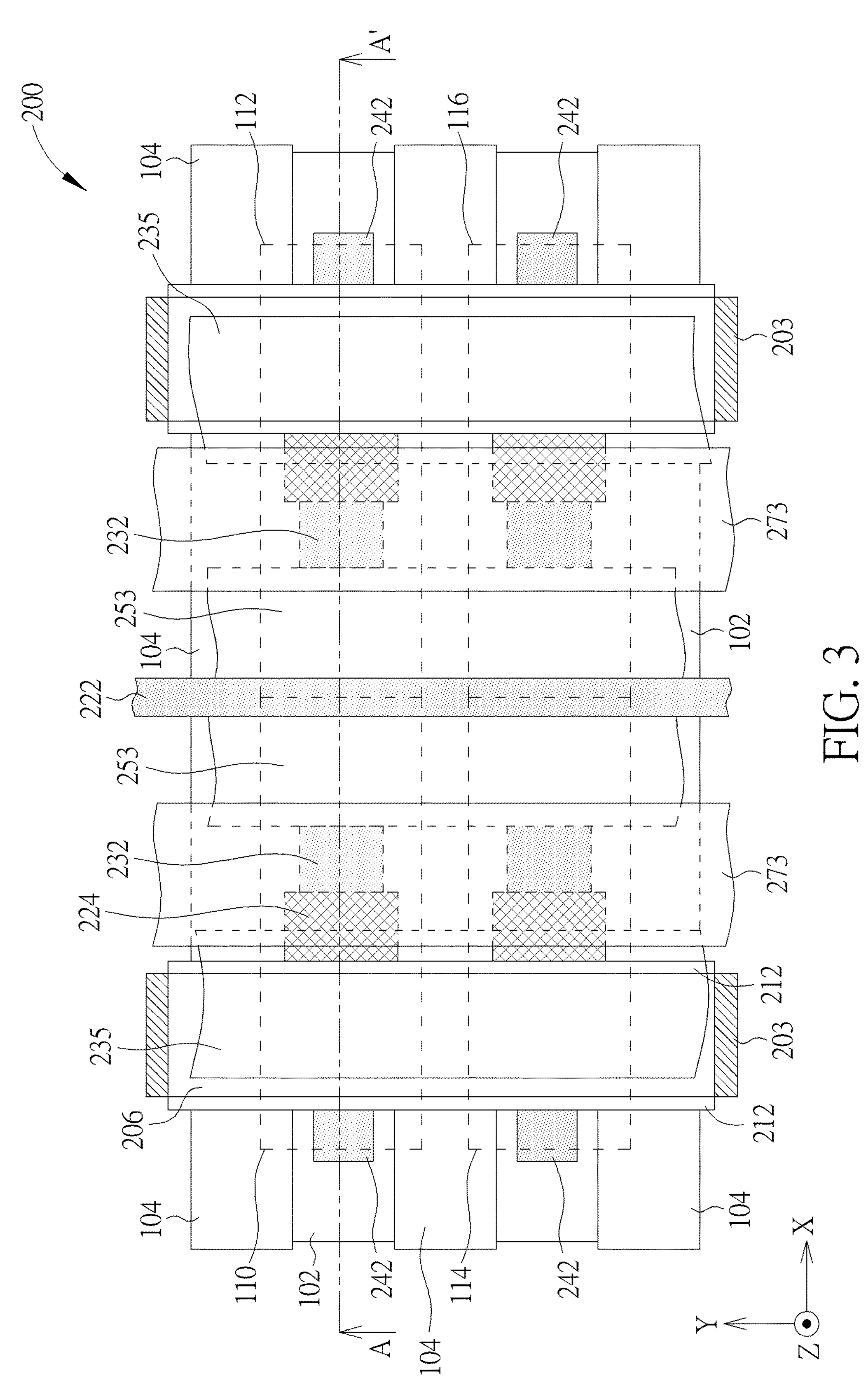

FIG. 3 is a schematic top view of a non-volatile memory device according to one alternative embodiment of the disclosure.

Figure 4:
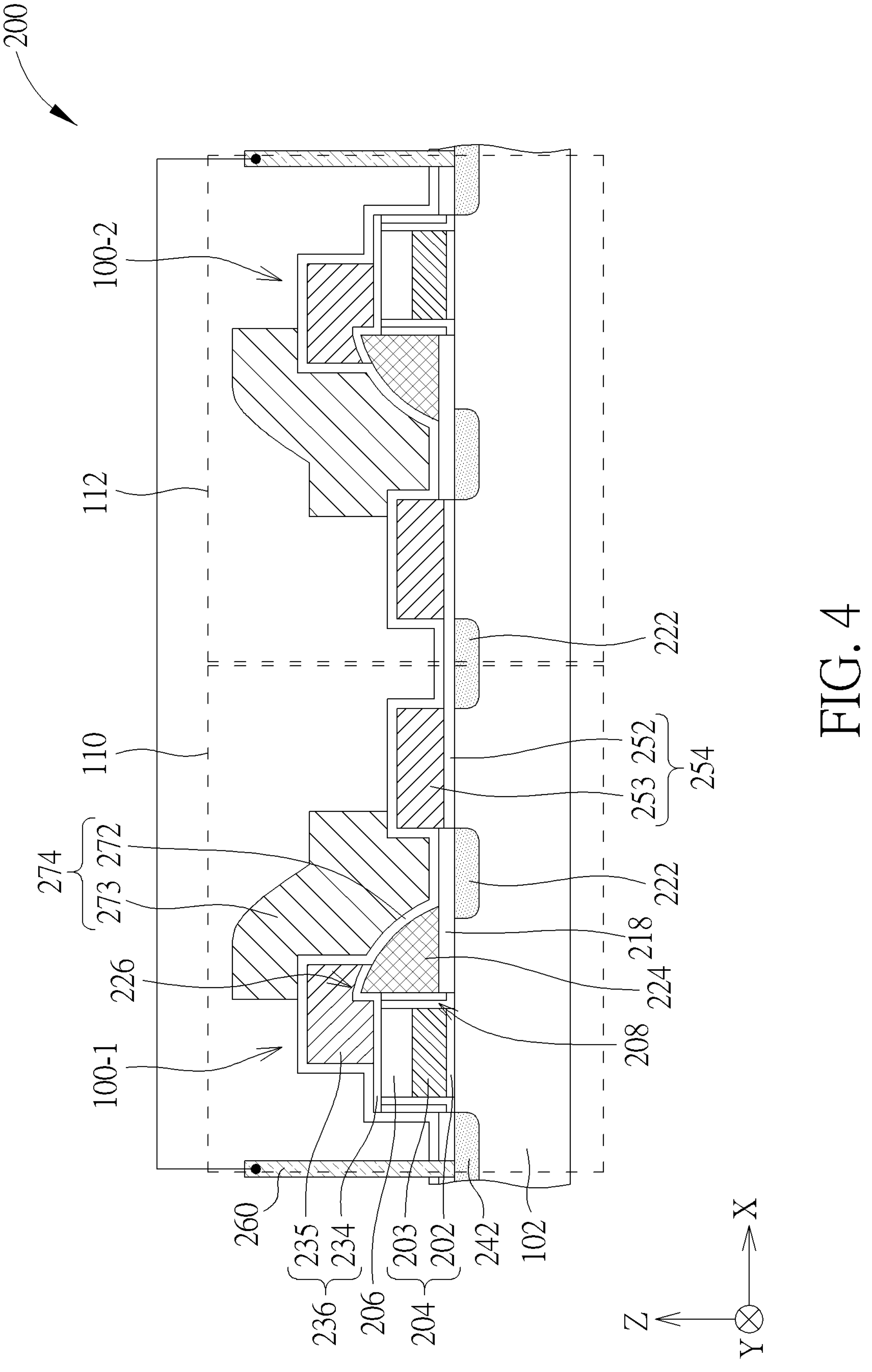

FIG. 4 is a schematic cross-sectional view of a non-volatile memory device taken along line A-A' of FIG. 3 according to one alternative embodiment of the present disclosure, where a control gate is filled into a gap between a select gate and a floating gate.

Figure 5:
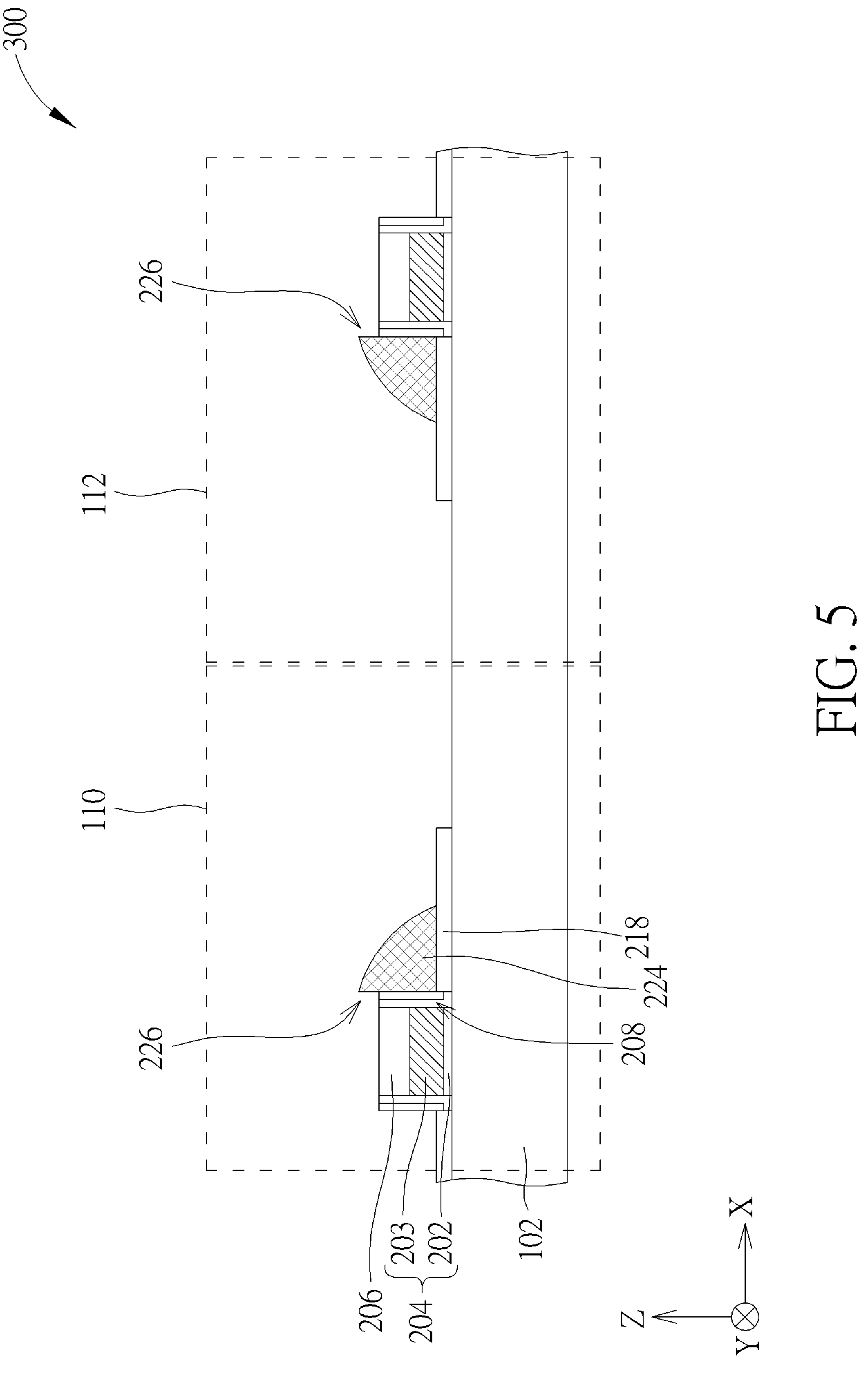
Figure 6:
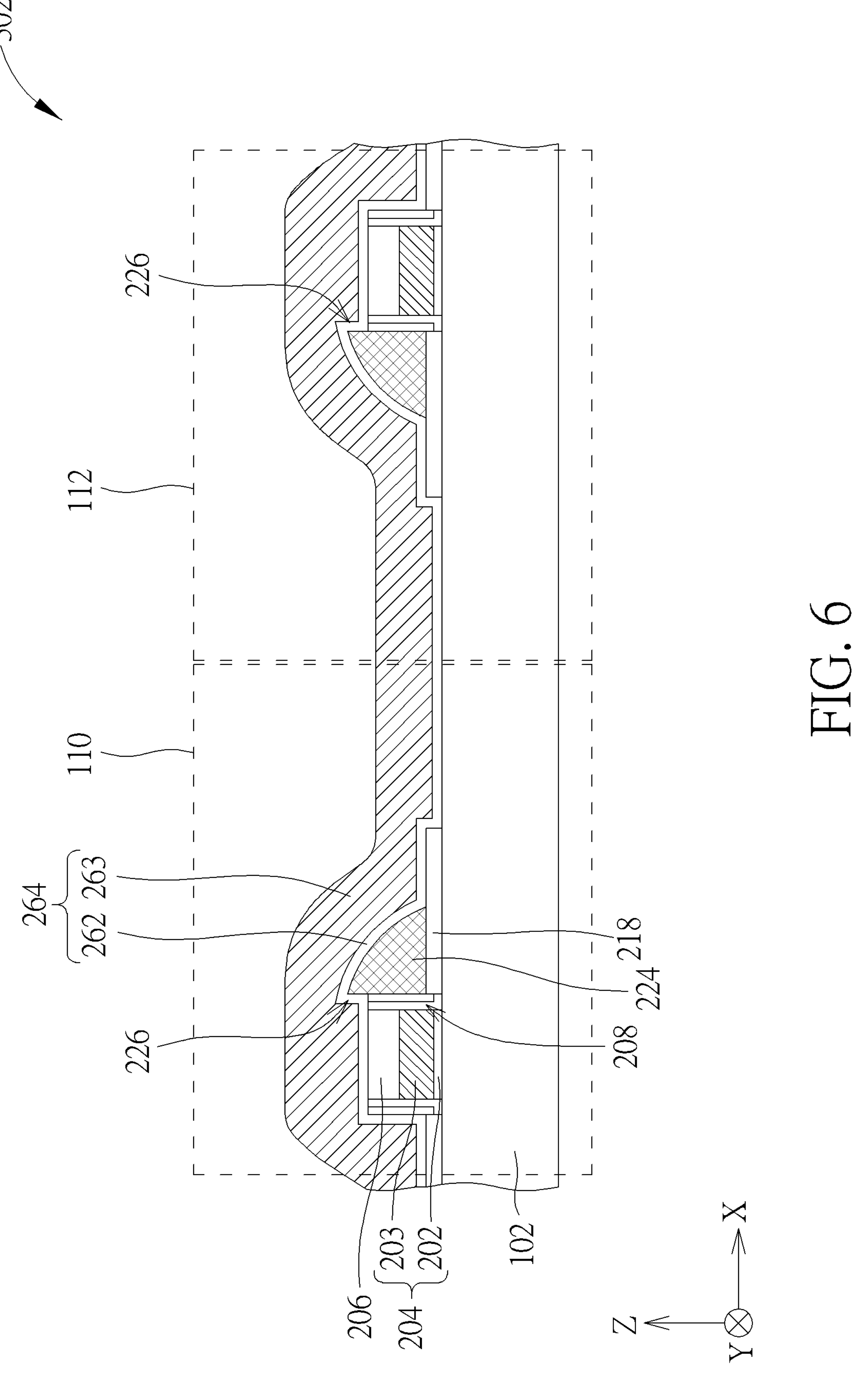
Figure 7:
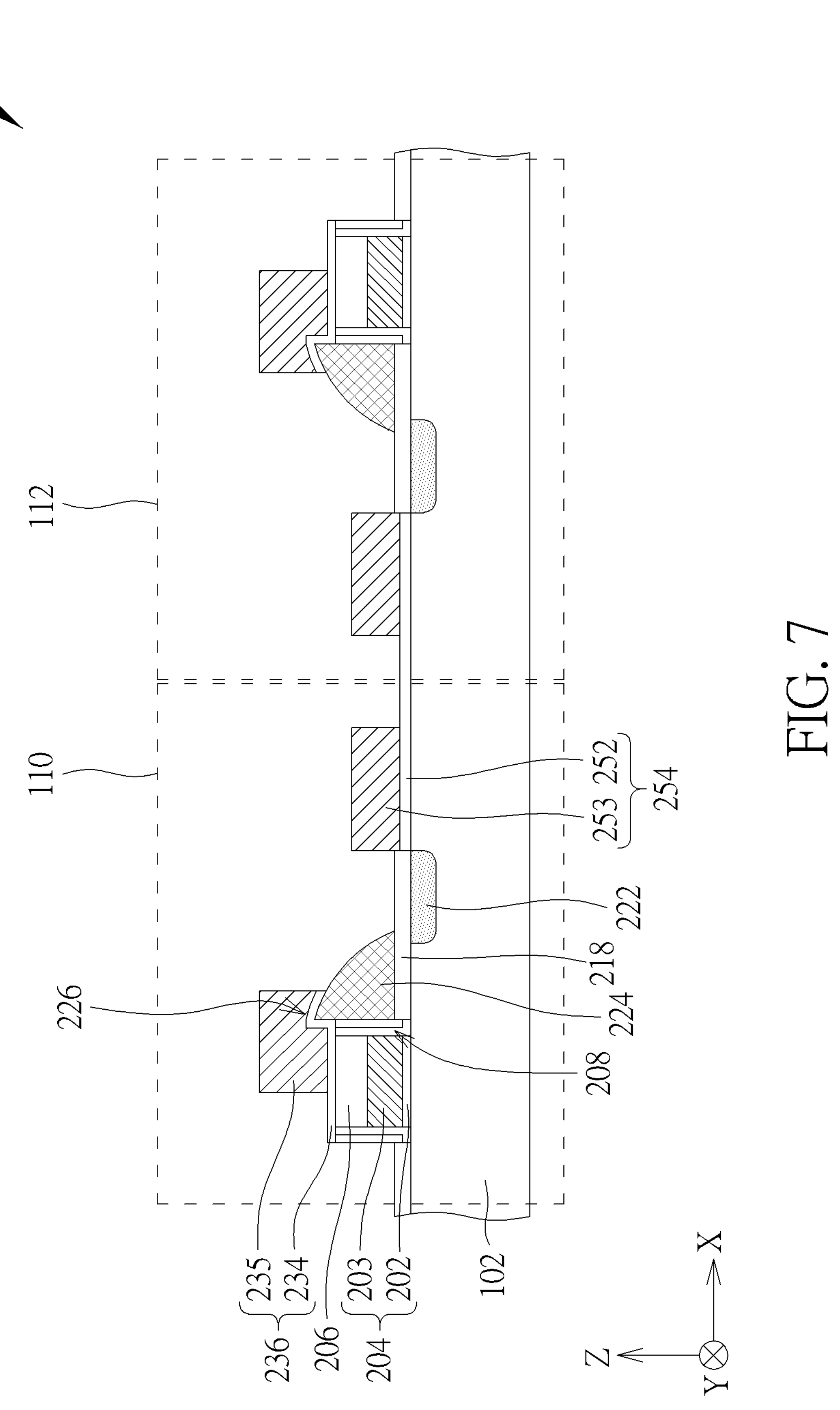

FIGS. 5-7 are schematic cross-sectional views at various stages of manufacture of a method for manufacturing the non-volatile memory device of FIGS. 1-4 according to one embodiment of the disclosure.

Figure 8:
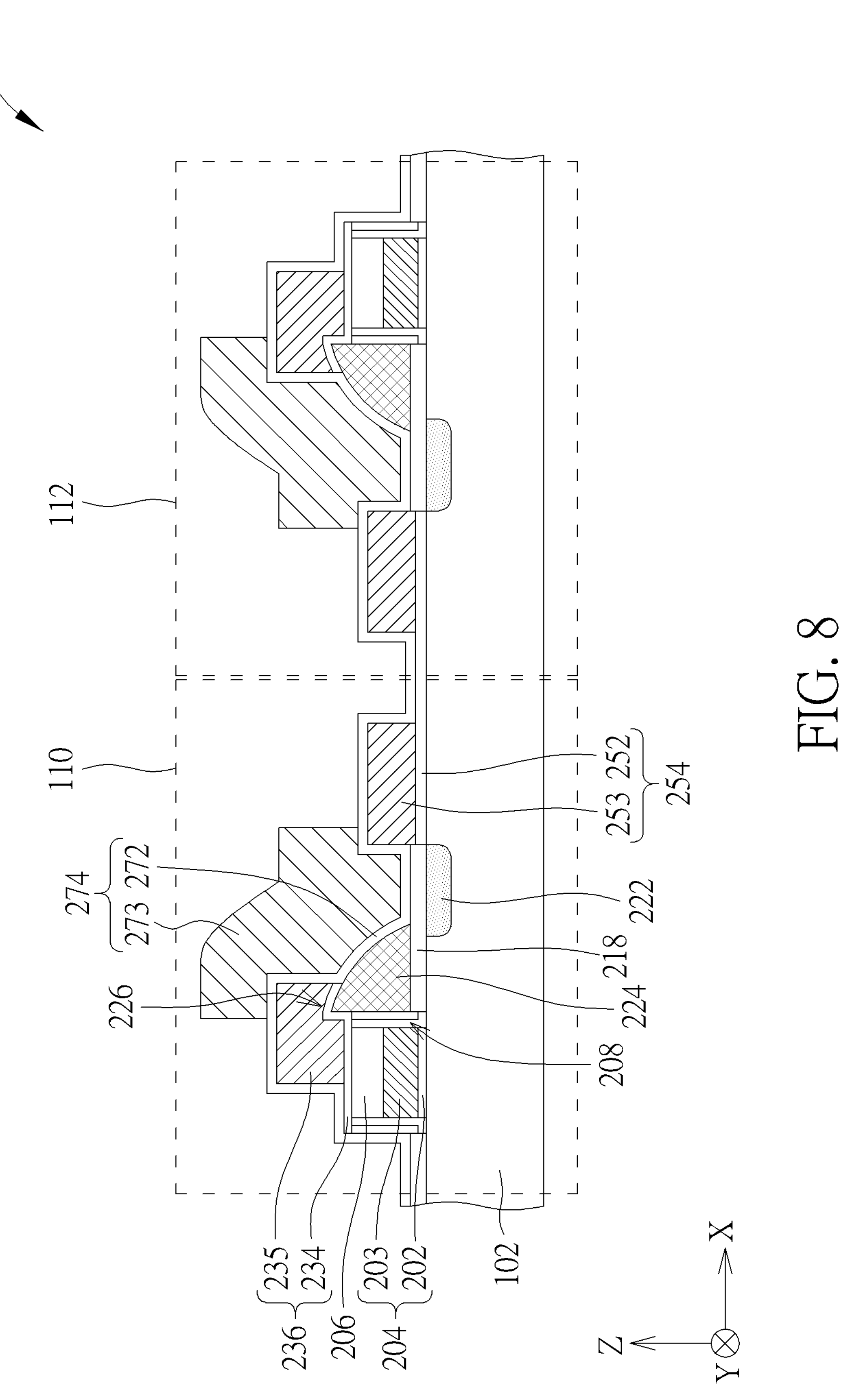

FIG. 8 is a schematic cross-sectional view at one stage of manufacture of a method for manufacturing the non-volatile memory device of FIGS. 3-4 according to one alternative embodiment of the disclosure.

Figure 9:
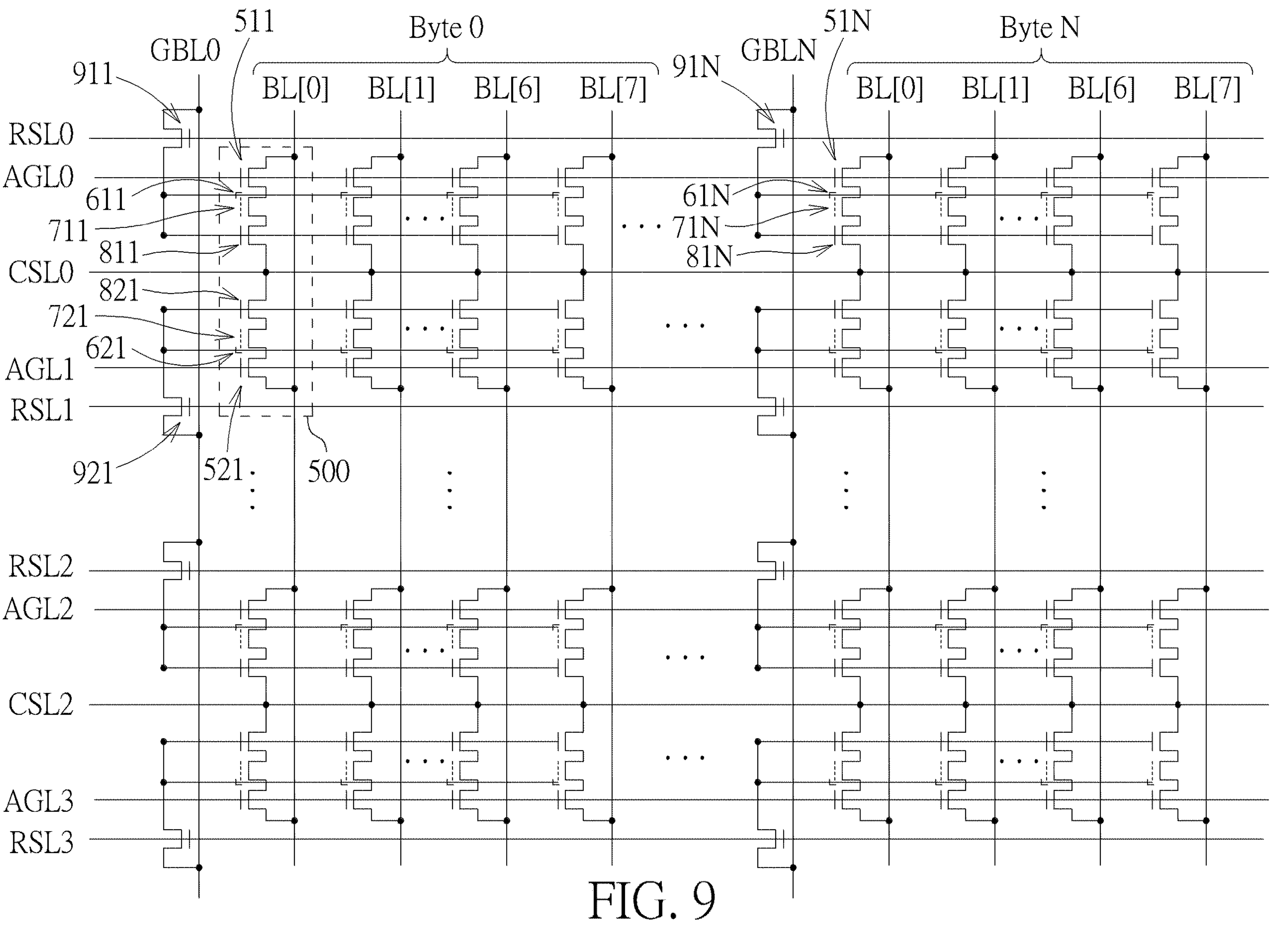

FIG. 9 is a simplified circuit diagram of a non-volatile memory device according to one embodiment of the disclosure.

Figure 10:
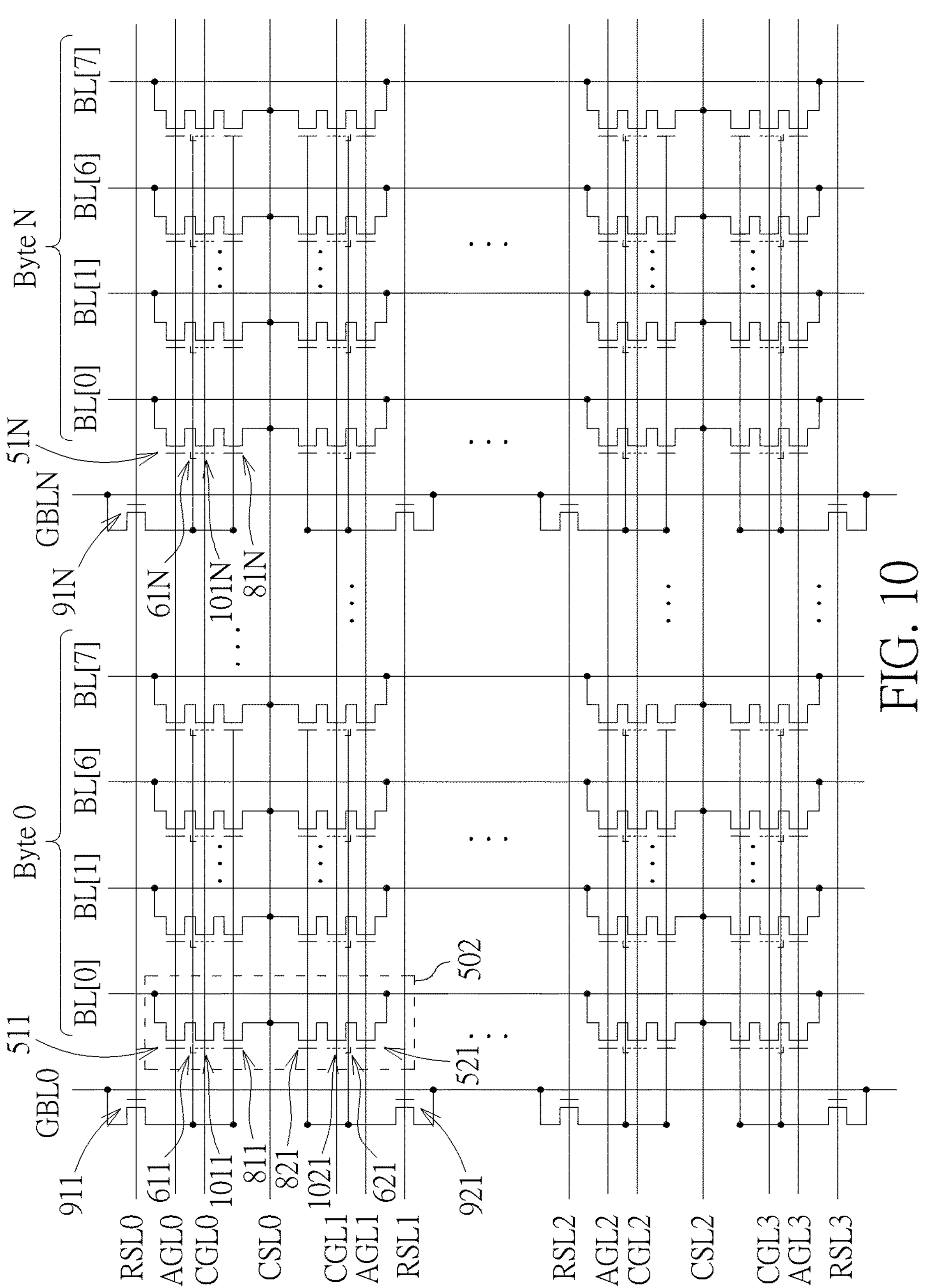

FIG. 10 is a simplified circuit diagram of a non-volatile memory device according to one alternative embodiment of the disclosure.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath”, “below”, “lower”, “under”, “on”, “over”, “above”, “upper”, “bottom”, “top” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. For example, if the device in the figures is turned over, elements described as “below” and/or “under” other elements or features would then be oriented “above” and/or “over” the other elements or features. The apparatus may be otherwise oriented (rotated 90 degrees or at other orientations) and the spatially relative descriptors used herein may likewise be interpreted accordingly.

Furthermore, as disclosed herein, the terms “coupled to” and “electrically connected to” include any directly and indirectly electrical connecting means. Therefore, if it is described in this document that a first component is coupled or electrically connected to a second component, it means that the first component may be directly connected to the second component, or may be indirectly connected to the second component through other components or other connecting means.

Although the disclosure is described with respect to specific embodiments, the principles of the disclosure, as defined by the claims appended herein, may obviously be applied beyond the specifically described embodiments of the disclosure described herein. Moreover, in the description of the present disclosure, certain details have been left out in order to not obscure the inventive aspects of the disclosure. The details left out are within the knowledge of a person having ordinary skill in the art.

Figure 1:
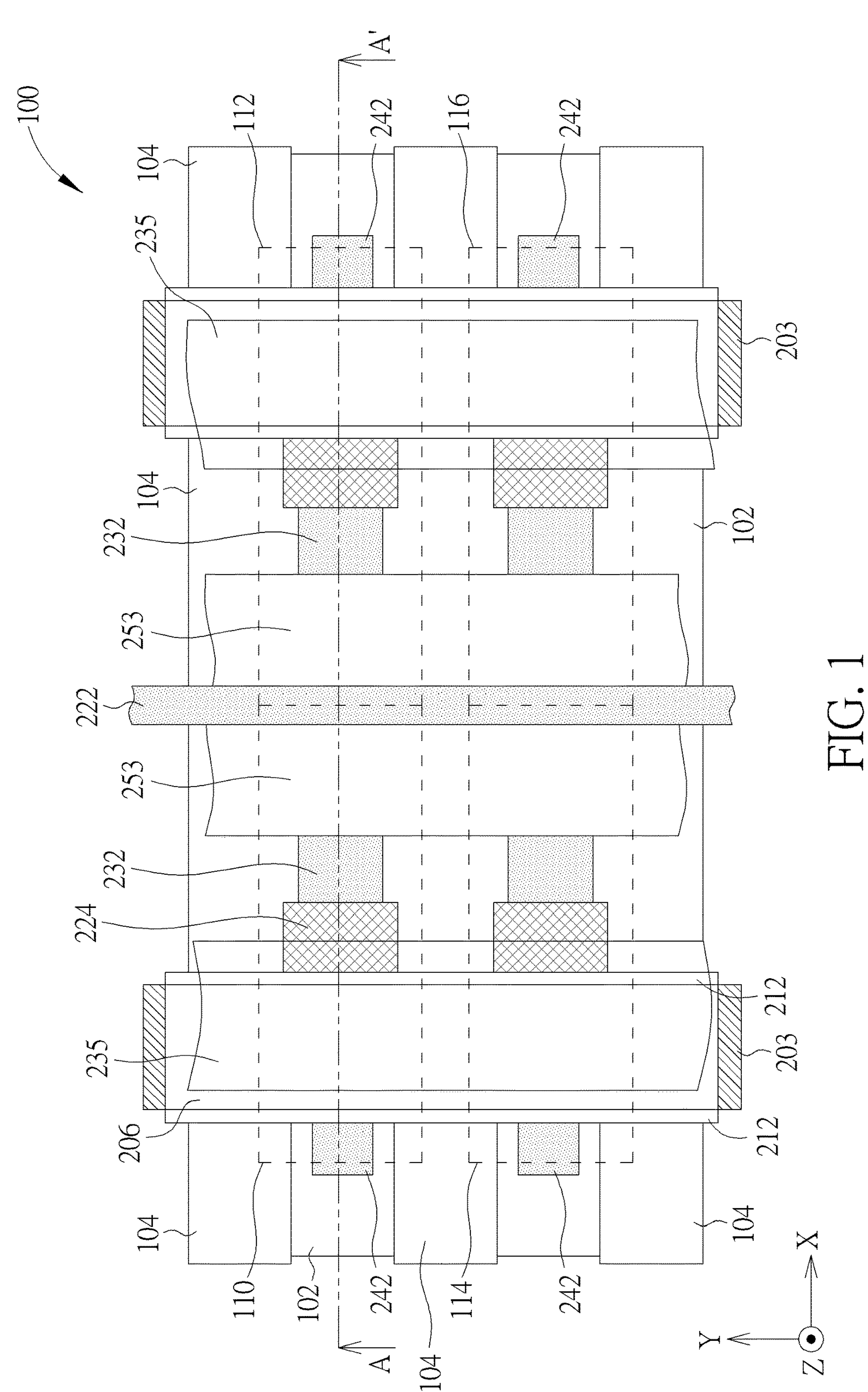
FIG. 1 is a schematic top view of a non-volatile memory device according to one embodiment of the disclosure.

FIG. 1 is a schematic top view of a non-volatile memory device according to one embodiment of the disclosure. Referring to FIG. 1, a non-volatile memory device 100 can be a NOR flash memory device including at least one memory cell. For example, the non-volatile memory device 100 can include four memory cells accommodated in the first, second, third, and fourth memory regions 110, 112, 114, and 116, respectively. The structures in the first memory region 110 and the second memory region 112 have a mirror image of each other, and the structures in the third memory region 114 and the fourth memory region 116 have a mirror image of each other.

According to one embodiment of the present disclosure, the non-volatile memory device includes more than four memory cells, such as more than 1.0E+8 memory cells, and these memory cells can be arranged in an array with numerous rows and columns. For example, every eight memory cells arranged along a Y-direction can constitute a byte, and each byte can be regarded as being accommodated in a byte region (not shown). Furthermore, 528 bytes arranged along a Y-direction can constitute a page, and each page can be regarded as being accommodated in a page region (not shown).

According to one embodiment of the present disclosure, the non-volatile memory device 100 includes numerous pairs of memory cells including upper cells and lower cells. For example, the memory cells respectively disposed in the first memory region 110 and the second memory region 112 can constitute a pair of memory cells, where one of the pair of memory cells is called an upper cell, and the other one of the pair of memory cells is called a lower cell.

Referring to FIG. 1, the non-volatile memory device includes a substrate 102 and an isolation structure 104. The substrate 102 can be a semiconductor substrate, such as a silicon substrate or a silicon-on-insulator (SOI) substrate, but not limited thereto. The isolation structure 104 can be made of an insulating material and is used to define active areas of the memory cells.

Each of the memory cells includes a plurality of doped regions disposed in the active area defined by the isolation structure 104. According to one embodiment of the present disclosure, the memory cell includes a first doped region such as a source region 222, a second doped region such as a drain region 242, and a third doped region such as a middle doped region 232. The source region 222, the drain region 242 and the middle doped region 232 are of the same conductivity type, such as n-type or p-type. The conductivity type of the source region 222, the drain region 242 and the middle doped region 232 is different from the conductivity type of the substrate 102, or different from the conductivity type of a doped well (not shown) used to accommodate the source region 222, the drain region 242 and the middle doped region 232. The source region 222 can be disposed at one end of the active area, and the drain region 242 can be arranged at another end of the active area. The middle doped region 232 is disposed between the source region 222 and the drain region 242.

According to some embodiments of the present disclosure, the source region 222 is a continuous region extending along a Y-direction and electrically connected to other memory cells arranged along the Y-direction. Two middle doped regions 232 respectively in the adjacent memory cells arranged along the Y-direction may be separated by the isolation structure 104.

Each memory cell can further include a stacked structure, and the stacked structure includes at least an assist gate 203, an insulation layer 206, and an upper gate 235, which are sequentially stacked upwards along a Z-direction. The stacked structure is disposed on the substrate 102 and adjacent to the drain region 242. The stacked structure can extend along the Y-direction and electrically connected to the memory cells arranged in the Y-direction. The assist gate 203 can be made of conductive material such as poly silicon or metal, and assist gate 203 can act as a word line configured to turn on/off the channel regions of the memory cells arranged in the Y-direction. The upper gate 203 can be made of conductive material such as poly silicon or metal.

An isolation material layer 208 can be disposed on the sidewalls of the assist gate 203 and the insulation layer 206 in order to insulate the assist gate 203 from other adjacent conductive components. The isolation material layer 208 can be a single-layered, double-layered, or a multi-layered spacer disposed on each sidewall of the assist gate 203, but not limited thereto.

Each memory cell further includes a floating gate 224 disposed on the substrate 102 and adjacent to the middle doped region 232. The floating gate 224 is disposed at one side of the assist gate 203, and the drain region 242 is disposed at another side of the assist gate 203. The floating gates 224 are made of conductive material, such as polysilicon or other semiconductor. The floating gates 224 in adjacent memory cells are spaced apart from each other so that the electric current could not directly transmitted between the floating gates 224. Since the floating gates 224 are spaced apart from each other, each the floating gate 224 can be programed or erased independently of each other. Thus, the state of each memory cell, such as state "1" or state "0" can be determined independently.

Each memory cell further includes a byte select gate 253 disposed on the substrate 102 between the source region 222 and the middle doped region 232. The byte select gate 253 can extend in the same direction such as the Y-direction as the assist gate 203 and the upper gate 235. The byte select gate 253 can also be electrically connected to the memory cells arranged in the Y-direction. The byte select gate 253 can be made of conductive material such as poly silicon or metal. By biasing the byte select gate 253, the channel region in the active region under the byte select gate 253 can be turned on/off to thereby control the size of current transmitted between the source region 222 and the middle doped region 232.

According to one embodiment of the present disclosure, each select gate 253 can be a continuous structure disposed in a single byte region and extending along the Y-direction. Each select gate 253 can be electrically connected to the eight memory cells in the corresponding byte region, and can be biased independently of the byte select gate 253 disposed in another byte region of the same page. Therefore, the memory cells in one byte region can be erased or programmed independently of the memory cells in another byte region.

Figure 2:
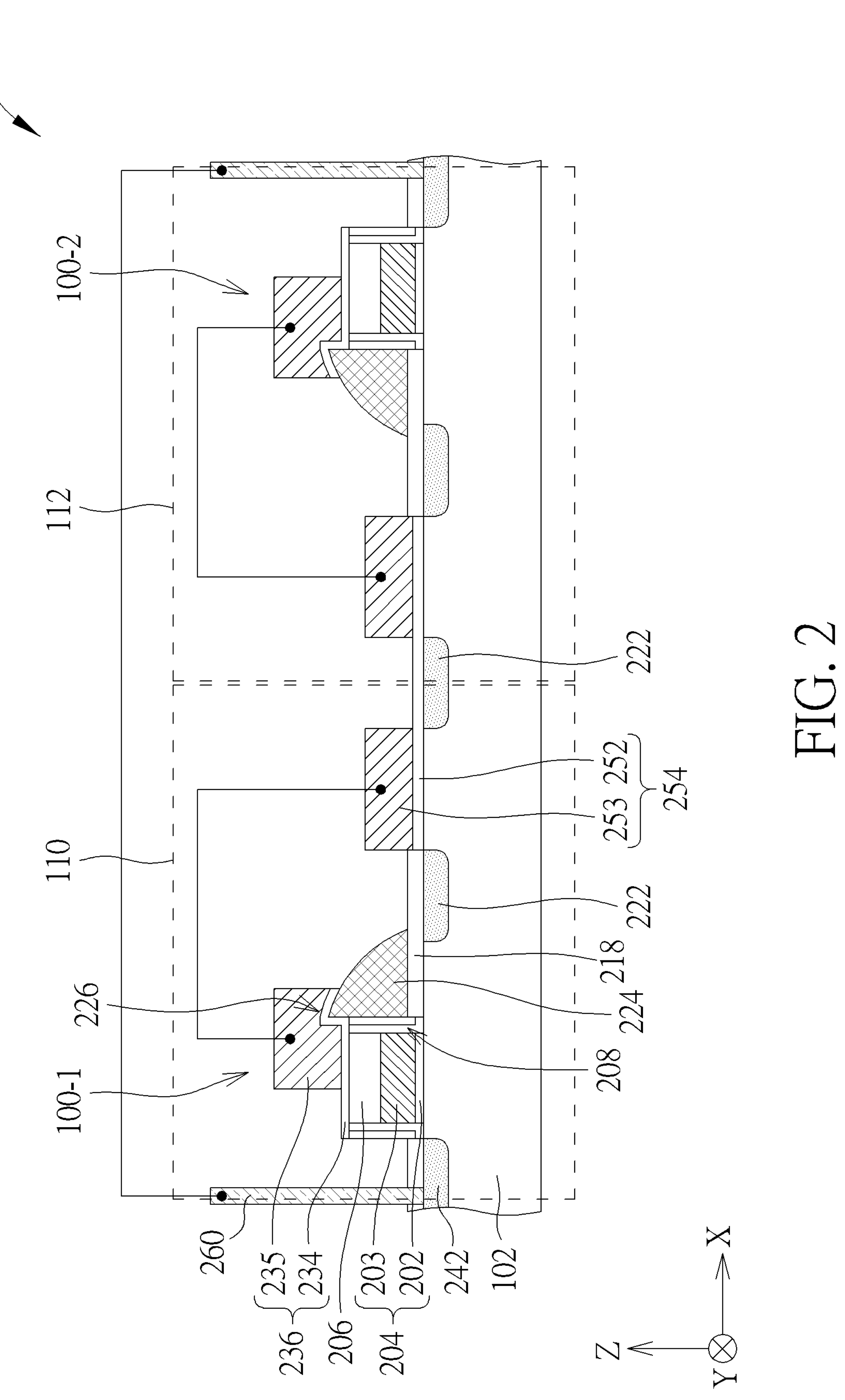
FIG. 2 is a schematic cross-sectional view of a non-volatile memory device taken along line A-A' of FIG. 1 according to one embodiment of the present disclosure, where a select gate is laterally spaced apart from an upper gate.

FIG. 2 is a schematic cross-sectional view of a non-volatile memory device taken along line A-A' of FIG. 1 according to one embodiment of the present disclosure, where a select gate is laterally spaced apart from an upper gate. Referring to FIG. 2, a first memory cell 100-1 and a second memory cell 100-2 are arranged along an X-direction and are disposed in the first memory region 110 and the second memory region 112 respectively, and have a mirror image of each other. In a corresponding circuit diagram, the first memory cell 100-1 and the second memory cell 100-2 can be disposed in the same column of a memory cell array, where the drain regions 242 of the first memory cell 100-1 and the second memory cell 100-2 are electrically coupled to each other.

Referring to the structure in the first memory region 110, the drain region 242, the middle doped region 232, and the source region 222 are separated from each other along the X-direction. The source region 222 is a common source region shared by the second memory region 110-2 in the second memory region 112.

A gate dielectric layer 202 is disposed between the substrate 102 and the assist gate 203. By biasing the assist gate 203 at predetermined voltage, the channel under the gate dielectric layer 202 can be turned on/off. The insulation layer 206 can be optionally disposed between the assist gate 203 and the upper gate 235 to prevent leakage current between them.

An upper gate structure 236 includes an upper gate dielectric layer 234 and the upper gate 235 stacked in order. The upper gate dielectric layer 234 can be made of dielectric layer which allows electrons to pass through it by Fowler-Nordheim (FN) tunneling mechanism. The upper gate 235 can be made of conductive material, such as polysilicon or metal. A top surface of the upper gate 235 is higher than a top surface of the floating gate 224. Besides, a portion of the upper gate 235 can extend beyond the sidewall of the assist gate 203 to cover an uppermost edge 226 of the floating gate 224 or further cover a portion of the floating gate 224. The uppermost edge 226 of the floating gate 224 is embedded in the erase gate 235. During an erase operation of the first memory cell 100-1, since electrons stored in the floating gate 224 can tunnel through the uppermost edge 226 of the floating gate 224 into the upper gate 235, the bias voltage applied to the upper gate 235 is relatively low such as lower than 13 V. As a result, erase efficiency is improved. Besides, according to some embodiments of the present disclosure, the upper gate 235 shown in FIG. 2 can act not only an erase gate capable of removing the electrons stored in the floating gate 224 but also a control gate capable of making hot electron tunnel from the carrier channel into the floating gate 224.

The floating gate 224 has a curved sidewall, and a portion of the curved sidewall can be covered with the upper gate 235. Although the floating gate 224 shown in FIG. 2 has the uppermost edge 226, the floating gate 224 may have other geometric shapes according to alternative embodiments of the disclosure. For example, the floating gate 224 with the curved sidewall may be replaced with an L-shaped floating gate (not shown) or a rectangular floating gate (not shown) when viewed in cross-section, and the top edge of the L-shaped or rectangular floating gate can also be covered with the upper gate 235.

A tunneling dielectric layer 218 is disposed on the substrate 102 and at least between the substrate 102 and the floating gate 224. The material of the tunneling dielectric layer 218 is, for instance, silicon oxide or other layers that allow hot electrons in the carrier channel to pass through it.

The byte select gate 253 is disposed on the substrate 102 between the middle doped region 232 and the source region 222. The byte select gate 253 can be spaced apart from the assist gate 203 and the upper gate 235, and the byte select gate 253 is spaced apart from the floating gate 224 by a gap which can be filled with dielectric layer (not shown) such as interlayer dielectric. The byte select gate 253 can be configured to be electrically connected to the upper gate 235. Thus, during a read, programming or erase operation, the byte select gate 253 can also receive a positive voltage when a positive voltage is applied to the upper gate 235. Besides, the select gates 253 respectively in the first memory cell 100-1 and the second memory cell 100-2 are spaced apart from each other, and are configured to be biased independently of each other.

A select gate dielectric layer 252 is disposed between the byte select gate 253 and the substrate 102, and the select gate dielectric layer 252 and the byte select gate 253 can constitute a select gate structure 254. According to some embodiments of the present disclosure, the select gate dielectric layer 252 may extend outward to cover the source region 222 and into adjacent memory cell, but not limited thereto.

According to some embodiments of the present disclosure, the select gate structure 254 and the upper gate structure 236 can be formed concurrently, and thus the byte select gate 253 can have the same composition as the upper gate 235.

According to some embodiments of the present disclosure, the non-volatile memory device can further include other components, such as vias, bit lines, interlayer dielectric and so forth, and the structure shown in FIG. 2 can be further modified based on actual requirements.

FIG. 3 is a schematic top view of a non-volatile memory device according to one alternative embodiment of the disclosure. The structure shown in FIG. 3 is analogous to the structure shown in FIG. 1, and the main difference between these two embodiments is that a non-volatile memory device 200 further includes control gates 273 extending in the Y-direction. The control gate 273 is made of conductive material, such as polysilicon or other semiconductor or metal.

According to some embodiments of the present disclosure, each control gate 273 can be a continuous structure extending in byte regions along the Y-direction. Thus, the memory cells arranged along the Y-direction (i.e. in the same page region) can be electrically connected to one single control gate 273. Besides, other memory cells in another page region can be electrically coupled to another single control gate 273. Therefore, the memory cells in one page region can be erased or programmed independently of the memory cells in another page region.

FIG. 4 is a schematic cross-sectional view of a non-volatile memory device taken along line A-A' of FIG. 3 according to one alternative embodiment of the present disclosure, where a control gate is filled into a gap between a select gate and a floating gate. Referring to FIG. 4, the control gate 273 is disposed on the substrate 102 and covers the select gate 203, the floating gate 224 and the upper gate 235. A portion of the control gate 273 can be filled into the gap between the select gate 203 and the floating gate 224, and that portion of the control gate 273 can cover the middle doped region 232 (or the third doped region).

A coupling dielectric layer 272 can be further disposed between the control gate 273 and the floating gate 224, and the coupling dielectric layer 272 and the control gate 273 can constitute a control gate structure 274. According to some embodiments of the present disclosure, the coupling dielectric layer 272 can conform to the shape of the floating gate 224. Besides, the coupling dielectric layer 272 can extend from below the control gate 273 and conformally cover the upper gate 235 and the byte select gate 253.

According to the embodiment shown in FIG. 4, the upper gate 235 can act as an erase gate capable of pulling the electrons out of the floating gate 224 through the uppermost edge or top edge of the floating gate 224. Besides, the control gate 273 is capable of attracting hot carriers (e.g. electrons) from the channel region into the floating gate 224.

FIGS. 5-7 are schematic cross-sectional views at various stages of manufacture of a method for manufacturing the non-volatile memory device of FIGS. 1-4 according to one embodiment of the disclosure.

Referring to FIG. 5, in a cross-sectional view 300, a substrate 102 is provided. The composition of the substrate 102 may include silicon, germanium, gallium nitride or other suitable semiconductor materials, but not limited thereto. Then, at least two stacked structures, each including an assist gate structure 204, an insulation layer 206 and a sacrificial layer (not shown) stacked in order, are formed on the substrate 102. The assist gate structure 204 includes an assist gate dielectric layer 203 and an assist gate 203. The assist gate 204 is made of conductive material, and the assist gate 204 is configured to turn on/off of a carrier channel region in the substrate 102 underlying the assist gate structure 204 when applying a suitable voltage to it. The insulation layer 206 is made of insulating material, such as silicon oxide, silicon oxide, or silicon oxynitride, but not limited thereto, which is used to electrically isolate the assist gate 203 from layers disposed above.

Then, the isolation material layer 208 is formed on the sidewalls of the stacked structures. The material of the isolation material layer 208 is, for instance, silicon oxide/silicon nitride/silicon oxide or silicon nitride/silicon oxide. After forming the isolation material layer 208, a tunneling dielectric layer 218 is formed on the substrate 102 at least between the stacked structures or further at both sides of the stacked structures. The material of the tunneling dielectric layer 218 is, for instance, silicon oxide, or other layers that allow hot electrons pass through it by tunneling effect. The forming method of the tunneling dielectric layer 218 is, for instance, a thermal oxidation or deposition method, but not limited thereto.

A floating gate 224, which is a spacer-shaped structure, is formed on one sidewall of each of the stacked structures, and an uppermost edge 226 of the floating gate 224 is higher than top surfaces of the assist gate 203 and the insulation layer 206. The method of forming the floating gate 224 may include the following steps. First, a conductive layer (not shown) is formed on the substrate 102. The material of the conductive layer is, for instance, doped polysilicon, polycide or other suitable conductive material. When the material of the conductive layer is doped polysilicon, its forming method includes, for instance, performing an ion implantation step after an undoped polysilicon layer is formed via a chemical vapor deposition method; or performing a chemical vapor deposition method with an in-situ dopant implantation method. Then, an etching process, such as an anisotropic etching process or an etch-back process, is performed to etch the conductive layer. As a result, a portion of the tunneling dielectric layer 218 between the stacked structures is exposed and the floating gate 224 is formed.

After forming the floating gate 224, the sacrificial layer disposed on the insulation layer 206 is removed completely until a top surface of the insulation layer 206 is exposed.

During removing the sacrificial layer, a portion of the insulation layer 206 may be removed slightly. Besides, a portion of the isolation material layer 208 disposed between the stacked structure and the floating gate 224 can be removed. The method of removing the sacrificial layer and a portion of the insulation layer 206 is, for instance, a wet etching method or a dry etching method, but not limited thereto. By performing the abovementioned etching process, a portion of the sidewall of the floating gate 224 originally covered with the sacrificial layer can be exposed.

Referring to FIG. 6, in a cross-sectional view 302, a stacked layer 264 including a dielectric layer 262 such as gate dielectric layer 262 and a conductive layer 263 such as gate conductive layer is formed on the substrate 102 by a blanket deposition process. The stacked layer 264 can be a conformal and continuous layer extending between adjacent memory cells. The stacked layer 264 covers the assist gates 203 and the floating gates 224 in all memory regions such as the first memory region 110 and the second memory region 112, and the uppermost edge 226 of each floating gate 224 can be embedded in the stacked layer 264.

The dielectric layer 262 can be formed by a chemical vapor deposition process, and the material of the dielectric layer 262 is, for instance, silicon oxide or silicon oxynitride. The material of the conductive layer 263 is, for instance, doped polysilicon or polycide. When the material of the conductive layer 263 is doped polysilicon, the forming method thereof includes, for instance, performing an ion implantation step after an undoped polysilicon layer is formed via a chemical vapor deposition method; or performing a chemical vapor deposition method with an in-situ dopant implantation method.

After the formation of the stacked layer 264, a patterning process, such as a photolithography and etching process, can be performed to remove portions of the stacked layer 264 to obtain the structure shown in FIG. 7.

Referring to FIG. 7, after patterning the stacked layer 264 shown in FIG. 6, pairs of upper gates 235 and byte select gates 253 are obtained, and each of the memory regions 110, 112 can accommodate a pair of upper gate 235 and byte select gate 253. The upper gates 235 and the byte select gates 253 can extend along the same direction such as the Y-direction as the assist gate 203. Since the upper gates 235 and the byte select gates 253 can be formed concurrently, the process for manufacturing the upper gates 235 and the select gates 253 is not complicated. Besides, in some embodiments, the upper gate 235 and the byte select gate 253 can have substantially the same composition.

After the upper gate 235 and the byte select gate 253 are formed, an ion implantation process is performed to form a third doped region 232 between the floating gate 224 and the byte select gate 253. Afterwards, a source region, a drain region and other components may be formed so as to obtain a non-volatile memory device similar to that shown in FIGS. 1-4.

FIG. 8 is a schematic cross-sectional view at one stage of manufacture of a method for manufacturing the non-volatile memory device of FIGS. 3-4 according to one alternative embodiment of the disclosure. In a cross-sectional view 400 of FIG. 8, a structure at this stage of manufacture can be regarded as proceeding from the stage of manufacture in FIG. 7. After the structure shown in FIG. 7 is obtained, a blank deposition process may be performed to form a coupling dielectric layer 272 which conforms to the shape of the floating gate 224. Besides, the coupling dielectric layer 272 can conformally cover the upper gate 235 and the byte select gate 253. Then, an additional deposition and etching process can be performed to thereby form a control gate 273 in each memory region 110, 112. The control gate 273 covers the upper gate 235, the floating gate 224 and the byte select gate 253.

After the control gate 273 is formed, a source region, a drain region and other components may be formed so as to obtain a non-volatile memory device similar to that shown in FIGS. 3-4.

FIG. 9 is a simplified circuit diagram of a non-volatile memory device according to one embodiment of the disclosure. In the circuit diagram shown in FIG. 9, a pair of memory cells including an upper memory cell and a lower memory cell in a region 500 can correspond to the first memory cell 100-1 and the second memory cell 100-2 shown in FIG. 1 and FIG. 2 respectively. Each of the memory cells includes an assist transistor, a floating gate transistor including a control gate and an erase gate, and a byte select transistor. Taken some of the memory cells as an example, each of the memory cells includes an assist transistor 511, 51N, 521, a floating gate transistor 711, 71N, 721 including a control/erase gate 611, 61N, 621, and a byte select transistor 811, 81N, 821.

A plurality memory cells shown in FIG. 9 are arranged in an array of rows and columns. In some embodiments, the memory cells arranged in the same row can be grouped into N+1 bytes, such as Byte 0, Byte 1 . . . Byte N, where N is an integer greater than 1, and drain terminals of all the eight memory cells in each byte can be electrically connected to different bit lines BL[0], BL[1] . . . BL[7], respectively.

For the memory cells of Byte 0 and Byte N in the first row, by using an assist gate line AGL0, a gate of an assist transistor 511 of one memory cell in Byte 0 can be electrically connected to a gate of the assist transistor 51N of one memory cell in Byte N. In contrast, a gate of a byte select transistor 811 of one memory cell in Byte 0 is only electrically connected to the gates of the byte select transistors in the same byte, i.e. Byte 0, and the gate of the byte select transistor 811 in Byte 0 is driven independently of a gate of a byte select transistor 81N in Byte N. Similarly, a gate (also called a control/erase gate) 611 of a floating gate transistor 711 of one memory cell in Byte 0 is only electrically connected to the gates of the floating gate transistors in the same byte, i.e. Byte 0, and the gate (also called the control/erase gate)) 611 of the floating gate transistor 711 in Byte 0 is driven independently of a gate 61N of a floating gate transistor 71N in Byte N.

Row select transistors, such as row select transistors 911 . . . 91N, can be arranged in a logic region outside the cell regions and electrically connected to the memory cells in different bytes. In some embodiments, the Row select transistors 911, 91N, 921 can each includes a drain terminal, a gate terminal and a source terminal. The drain terminals of the row select transistors 911, 91N, 921 can be electrically connected to corresponding global byte lines GBL0, GBLN, and the global byte lines GBL0, GBLN can be driven independently. The gate terminals of the row select transistors 911, 91N, 921 in the same row can be electrically connected to each other by a row select line RSL0, RSL1. The source terminals of the row select transistors 911, 91N, 921 can be electrically connected to the gates of the floating gate transistors and the select transistors in the corresponding byte. For example, the source terminal of the row select transistors 911 can be electrically connected to the gate (also called the control/erase gate) 611 of the floating gate transistor 711 and to the gate of the byte select transistor 811, and the source terminal of the row select transistors 911 can also be connected to other gates of the floating gate transistor and the select transistor in the same byte Byte 0. However, the source terminal of the row select transistors 911 is not electrically connected to the transistors in another byte such as Byte N.

In some embodiments of the present disclosure, a non-volatile memory device includes at least one row of memory cells, at least one first erase gate line, at least one second erase gate line, at least one first select gate line, and a second select gate line. The memory cells are arranged in a first byte region and second byte region respectively, and each memory cell includes an assist transistor, a floating gate transistor, and a byte select transistor electrically connected in series. The first erase gate line is electrically connected to the erase gates of the floating gate transistors in the first byte region such as Byte 0. The second erase gate line is electrically connected to the erase gates of the floating gate transistors in the second byte region such as Byte N, and the second erase gate line is configured to be biased independently of the first erase gate line. The first select gate line is electrically connected to the select gates of the byte select transistors 811 in the first byte region Byte 0. The second byte select gate line is electrically connected to the byte select gates of the byte select transistors 81N in the second byte region Byte N, and the second byte select gate line is configured to be biased independently of the first byte select gate line.

During an erase operation of the memory cells in the same row, a positive voltage such as 12V can be applied to the gate 611 of the floating gate transistor and the gate 811 of the byte select transistor 811 of the selected byte by turning on the corresponding row select transistor 911 and biasing the corresponding global byte line GBL0.

In contrast, for non-selected byte in byte region Byte 0 but in another row, since the row select transistor in this row is electrically connected to the row select line RSL1 and there is no or negligible voltage applied to the row select line RSL1, the data stored in the non-selected byte in byte region Byte 0 but in another row can remain. Thus, only the data stored in the selected byte is erased.

Similarly, for non-selected byte in the same row as the selected byte but in different byte region Byte N, although the row select transistors 911, 91N share the same row select line RSL0, there is no or negligible voltage applied to the global byte line GBLN. Thus, voltage is not applied to the gate of the floating gate transistor and the gate of the select transistor of the non-selected byte, and the data stored in the non-selected byte in the same row as the selected byte but in different byte region Byte N can also remain. Thus, only the data stored in the selected byte is erased.

During a programming operation of the memory cells in the same row, a positive voltage such as 8V can be applied to the gate of the floating gate transistor 711 and the gate of the byte select transistor 811 of the selected byte Byte 0 by turning on the corresponding row select transistor 911 and biasing the corresponding global byte line GBL0. In contrast, voltage is not applied to the gate of the floating gate transistor 71N and the gate of the byte select transistor 81N of the non-selected byte Byte N. Thus, only the memory cells in the selected byte Byte 0 are programmed, and the memory cells in the non-selected byte Byte N can remain at their original states.

FIG. 10 is a simplified circuit diagram of a non-volatile memory device according to one alternative embodiment of the disclosure. The circuit diagram shown in FIG. 10 is analogous to the circuit diagram shown in FIG. 9, the main difference is that the floating gate transistor 1011, 101N, 1021 further includes a control gate and an erase gate separated from each other. In the circuit diagram shown in FIG. 10, a pair of memory cells including an upper memory cell and a lower memory cell in a region 502 can correspond to the first memory cell 100-1 and the second memory cell 100-2 shown in FIG. 3 and FIG. 4 respectively. Each of the memory cells includes the assist transistor 511, 51N, 521, the floating gate transistor 1011, 101N, 1021 including the control gate and erase gate, and the byte select transistor 811, 81N, 821.

For the memory cells of Byte 0 and Byte N in the first row, by using a control gate line CGL0, the control gate of the floating gate transistor 1011 of one memory cell in Byte 0 can be electrically connected to the control gate of the floating gate transistor 101N of one memory cell in Byte N.

Other components in the circuit diagram of FIG. 10 are analogous to the components in the circuit diagram of FIG. 9. The detailed description of these components is omitted for the sake of clarity.

During an erase operation of the memory cells in the same row, a negative voltage such as −7V can be applied to the control gate of the floating gate transistor 1011 of each memory cell in the same row. A positive voltage such as 8V can be applied to the erase gate 611 of the floating gate transistor 1011 and the gate of the byte select transistor 811 of the selected byte by turning on the corresponding row select transistor 911 and biasing the corresponding global byte line GBL0. In contrast, voltage is not applied to the erase gate 61N of the floating gate transistor 101N and the gate of the byte select transistor 81N of the non-selected byte Byte N. Thus, only the data stored in the selected byte Byte 0 is erased, and the data stored in the non-selected byte Byte N can remain.

During a programming operation of the memory cells in the same row, a positive voltage such as 8V can be applied to the control gate of the floating gate transistor 1011 of each memory cell in the same row. A positive voltage such as 8V can be applied to the erase gate 611 of the floating gate transistor 1011 and the gate of the byte select transistor 811 of the selected byte by turning on the corresponding row select transistor 911 and biasing the corresponding global byte line GBL0. In contrast, voltage is not applied to the erase gate 61N of the floating gate transistor 101N and the gate of the byte select transistor 81N of the non-selected byte. Thus, only the memory cells in the selected byte Byte 0 are programmed, and the memory cells in the non-selected byte Byte N can remain at their original states.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A non-volatile memory device, comprising at least one memory cell, wherein the at least one memory cell comprises:
- a substrate comprising a first doped region and a second doped region;
- an assist gate disposed on the substrate and adjacent to the second doped region;
- a byte select gate disposed on the substrate and adjacent to the first doped region;
- a floating gate disposed on the substrate and between the assist gate and byte select gate, wherein the floating gate comprises an upper edge higher than top surfaces of the assist gate and the byte select gate; and an upper gate covering the assist gate and the floating gate, wherein the upper gate is laterally spaced apart from the byte select gate, and the upper edge of the floating gate is embedded in the upper gate, wherein the byte select gate is configured to turn on or turn off a channel region in the substrate under the byte select gate, and wherein the byte select gate is configured to be electrically connected to the upper gate.

2. The non-volatile memory device of claim 1, wherein the assist gate has the same composition as the byte select gate.

3. The non-volatile memory device of claim 1, wherein the assist gate is laterally spaced apart from the byte select gate.

4. The non-volatile memory device of claim 1, wherein the assist gate, the byte select gate, and the upper gate extend along a same direction.

5. The non-volatile memory device of claim 1, wherein the at least one memory cell further comprises a control gate covering the byte select gate, the floating gate, and the upper gate.

6. The non-volatile memory device of claim 5, wherein the floating gate and the byte select gate are laterally spaced apart from each other by a gap, and the control gate fills up the gap.

7. The non-volatile memory device of claim 5, wherein the at least one memory cell further comprises a third doped region disposed between the first doped region and the second doped region, and the third doped region being covered with the control gate.

8. The non-volatile memory device of claim 5, wherein the at least one memory cell further comprises a coupling dielectric layer disposed under the control gate and conformally covering the floating gate and the upper gate.

9. The non-volatile memory device of claim 1, wherein the at least one memory cell comprises two adjacent memory cells arranged in a same column and having a mirror image of each other.

10. The non-volatile memory device of claim 9, wherein the second doped regions of the two adjacent memory cells arranged in the same column are configured to be electrically connected to each other.

11. The non-volatile memory device of claim 9, wherein the byte select gates of the two adjacent memory cells arranged in the same column are spaced apart from each other.

12. The non-volatile memory device of claim 1, further comprises two adjacent byte regions arranged in a same row, and the at least one memory cell comprises two memory cells respectively disposed in the two adjacent byte regions, wherein the assist gates respectively disposed in the two memory cells are configured to be electrically connected to each other, and the byte select gates respectively disposed in the two memory cells are configured to be electrically isolated from each other.

13. A non-volatile memory device, comprising:

a row of memory cells arranged in a first byte region and second byte region respectively, wherein each memory cell comprises an assist transistor, a floating gate transistor, and a byte select transistor being connected in series;

a first erase gate line electrically connected to erase gates of the floating gate transistors in the first byte region;

a second erase gate line electrically connected to erase gates of the floating gate transistors in the second byte region, wherein the second erase gate line is configured to be biased independently of the first erase gate line;

a first select gate line electrically connected to select gates of the byte select transistors in the first byte region; and a second select gate line electrically connected to select gates of the byte select transistors in the second byte region, wherein the second select gate line is configured to be biased independently of the first select gate line, wherein the erase gates of the floating gate transistors in the first byte region are electrically connected to the select gates of the byte select transistors in the first byte region.

14. The non-volatile memory device of claim 13, further comprising an assist gate line electrically connected to assist gates of the assist gate transistors in the first byte region and the second byte region.

15. The non-volatile memory device of claim 13, further comprising a first row select transistor and a second row select transistor in a same row, wherein each of the first and second row select transistors comprises a source terminal, a drain terminal and a gate terminal, and the source terminals of the first and second row select transistors are electrically connected to the memory cells in a first byte region and second byte region respectively.

16. The non-volatile memory device of claim 15, wherein the source terminals of the first and second row select transistors are electrically isolated from each other.

17. The non-volatile memory device of claim 16, further comprising a first byte conductive line and a second byte conductive line respectively electrically connected to the drain terminals of the first and second row select transistors.

* * * * *